(12) United States Patent  
Yang (10) Patent No.: US 6,178,114 B1  
(45) Date of Patent: Jan. 23, 2001

(54) SENSING APPARATUS AND METHOD FOR FETCHING MULTI-LEVEL CELL DATA

(75) Inventor: Nien Chao Yang, Hsinchu (TW)

(73) Assignee: Macronix International Co., Ltd., Hsinchu (TW)

( * ) Notice: Under 35 U.S.C. 154(b), the term of this patent shall be extended for 0 days.

(21) Appl. No.: 09/229,454

(22) Filed: Jan. 12, 1999

(51) Int. Cl.$^7$ ............................. G11C 16/26; G11C 17/12
(52) U.S. Cl. ............................ 365/185.03; 365/185.2; 365/185.21; 365/104; 365/184; 365/168
(58) Field of Search ................ 365/185.03, 185.2, 365/104, 184, 168, 185.21

(56) References Cited

U.S. PATENT DOCUMENTS

| | | | |
|---|---|---|---|
| 5,012,448 | 4/1991 | Matsuoka et al. | 365/208 |
| 5,021,999 | * 6/1991 | Kohda et al. | 365/168 |
| 5,457,650 | 10/1995 | Sugiura et al. | 365/184 |
| 5,543,738 | 8/1996 | Lee et al. | 327/51 |
| 5,619,448 | 4/1997 | Lin | 365/185.03 |
| 5,668,752 | 9/1997 | Hashimoto | 365/104 |
| 5,721,701 | 2/1998 | Ikebe et al. | 365/185.03 |
| 5,729,490 | * 3/1998 | Calligaro et al. | 365/185.03 |

FOREIGN PATENT DOCUMENTS

| | | | |
|---|---|---|---|
| 0 740 305 | 10/1996 | (EP) | G11C/11/56 |
| 0 797 212 | 9/1997 | (EP) | G11C/11/56 |

OTHER PUBLICATIONS

Calligaro et al., "Comparative Analysis of Sensing Schemes for Multilevel Non–Volatile Memories," 1996 Innovative Systems in Silicon Conference, Session 10: Innovations in Memory Systems, May 1997 IEEE, pp. 266–273.

* cited by examiner

Primary Examiner—Andrew Q. Tran
(74) Attorney, Agent, or Firm—Mark A. Haynes; Haynes & Beffel LLP (57) ABSTRACT

A reading circuit for a multibit memory cell in a memory array, the memory cell having a threshold gate voltage within a range of one of a first, second, third and fourth predetermined threshold voltages corresponding respectively to one of four states of two bits stored in the memory cell. The reading circuit includes a circuit to provide a gate voltage to the multibit memory cell during a read cycle, the gate voltage having a first level between the second and third predetermined threshold voltages during a first time interval of the read cycle and a second level between the third and fourth predetermined threshold voltages during a second time interval of the read cycle. A sensing circuit is coupled to the multibit memory cell which compares current from the multibit memory cell to a first reference current and to a second reference current, and produces a first output during the first time interval having a first logic state if the current from the cell exceeds the first reference current, and having a second logic state if the current from the cell is less than the first reference current. The sensing circuit produces a second output during the second time interval having a first logic state if the current from the cell is less than the second reference current and greater than the first reference current, and a second logic state if the current from the cell is greater than the second reference current and less than the first reference current.

23 Claims, 10 Drawing Sheets

SENSING APPARATUS AND METHOD FOR FETCHING MULTI-LEVEL CELL DATA

BACKGROUND OF THE INVENTION

1. Field of the Invention

The field of the present invention relates to a multi-stage semiconductor memory and the sensing of multi-level memory cell data; and in particular to a method and apparatus for sensing multi-level cell data in one read cycle.

2. Description of Related Art

In a conventional memory cell, one bit of data is stored per cell. Popular classes of non-volatile semiconductor memory devices such as ROM and flash memory, have been modified to store more than one bit of data in one cell. This is accomplished by storing more than two threshold voltages $V_t$ either through different voltage threshold implantation for devices such as a MROM or by programming in devices such as flash cells.

A draw back to the MLC approach is that there is increased difficulty in sensing the various threshold voltages. This compromises the speed of reading the data. Also, since a more complicated sensing circuit is required additional chip area to implement the sense amplifier is required, increasing the cost of manufacturing a MLC.

Representative prior art sensing methods are described in U.S. Pat. No. 5,721,701 to Ikebe et al. entitled "HIGH READ SPEED MULTIVALUED READ ONLY MEMORY DEVICE"; and U.S. Pat. No. 5,543,738 to Lee et al. entitled "MULTI-STAGE SENSE AMPLIFIER FOR READ-ONLY MEMORY HAVING CURRENT COMPARATORS". These approaches in the prior art for two bit per cell memory, require three word line voltage levels for sensing the four possible combinations of two bits. The three levels are achieved in one prior art approach by applying the three levels in a three step sequence to the word line in each read cycle, sensing the cell output for each of the three levels. This three step sequence is relatively slow. The three levels are achieved in another approach by a two step sequence applying a first fixed word line voltage, and followed by a lower word line voltage or a higher word line voltage depending on the outcome of sensing during the first step. The two step technique in the prior art overcomes the slowness of the three step technique, but adds complexity because of the logic required to control the word line voltage during the second step. Further, the two step sequences of the prior art is limited to a single order of sensing.

What is needed is a novel method and apparatus for fetching MLC data with a fixed word-line voltage for all bits in the MLC independent of the order in which the bits are sensed. What is also needed is a sensing circuit with reduced complexity and reduced cost.

SUMMARY OF THE INVENTION

Accordingly, the present invention is directed to a novel sensing method and apparatus to fetch multi-level cell (MLC) data using fixed word line voltages for both bits, or for all bits in the cell.

The present invention is directed to a novel sensing method and apparatus to sense multiple bits of data from a multi-level cell using fixed word line voltages for both bits, or for all bits in the cell. The sensing technique allows sensing a single bit from the cell, does not require any particular order of sensing of the multiple bits within a single cell, and has a sensing margin which is similar to prior art multi-level cell sense amplifiers.

Thus, the present invention provides a reading circuit for a multi-bit memory cell in a memory array. In a two bit per cell embodiment, the memory cell has a threshold gate voltage within a range of one of a first, second, third and fourth predetermined threshold voltages. These four predetermined threshold voltages correspond respectively to the four states of two-bits stored in the memory cell. A circuit to provide a gate voltage to the multi-bit memory cell during a read cycle is included. The gate voltage has a first level between the second and third predetermined threshold voltages during a first time interval of the read cycle for sensing one bit, for example the low bit, of the multi-bit data, and a second level between the third and fourth predetermined threshold voltages during a second time interval of the read cycle for sensing the next bit, that is the high bit in the cell. The grouping of the first and the second threshold voltages and the third and the fourth threshold voltages are also referred to as the low threshold voltage group and the high voltage threshold group, respectively, during the low bit cycle. During the high bit cycle the second and third threshold voltages and the first and the fourth voltage threshold groups are referred to as the inner and outer threshold voltage groups, respectively.

A sensing circuit in one embodiment is coupled to the multi-bit memory cell and compares the current from the multi-bit memory cell to a first reference current and a second reference current. The sensing circuit produces a first output during the first time interval having a first logic state when the current from the first cell exceeds the first reference current and a second logic state if the current from the cell is less than the first reference. The sensing circuit produces a second output during the second time interval having a first logic state if the current from the cell is less than the second reference current and greater than the first reference current, and a second logic state if the current from the cell is greater than the first reference current and less than the second reference current. The first and second outputs of the sensing circuit indicate the two bits stored in the multi-bit cell. The sensing method described above can be expanded to include MLCs having more than four threshold levels. As the number of threshold levels increase, additional current sources and logic circuits with corresponding logic states would be required to determine the data stored in the MLC.

According to one preferred aspect, the sensing circuit includes a first comparator connected to receive the first reference current and a current from the multi-bit memory cell, and a second comparator connected to receive the second reference current and current from the multi-bit memory cell. Logic is coupled to the first and second comparators and operates during the first time interval to provide the output of the first comparator as the first output, and operates during a second time interval to provide the output of the first comparator as the second output if the output of the second comparator has a first value, and to provide the output of the first comparator inverted as the second output if the output of the second comparator has a second value.

According to various aspects of the present invention, the first time interval for sensing may occur prior to the second time interval, or the first time interval may occur after the second time interval depending on the bit to be sensed, or the preferred implementation of the sensing circuit.

Also, the present invention provides a method for sensing a particular bit in a plurality of bits in a multi-bit cell that has a threshold gate voltage within a range of one of a plurality of predetermined threshold voltages which includes a highest, a next to highest and a lowest predetermined threshold voltage. The method involves applying a gate voltage to the multi-bit cell between the highest and the next to highest predetermined threshold voltages, and determining a first value for the bit if the current from the cell is less than a reference current indicating that the threshold gate voltage is the highest predetermined threshold voltage, or if the current from the cell is greater than a reference current indicating that the threshold gate voltage is the lowest predetermined threshold voltage. The method includes determining a second value for the bit if the current from the cell is greater than the first reference current and less than the second reference current indicating that the threshold gate voltage is one of the other predetermined threshold voltages in the plurality of predetermined threshold voltages.

When the plurality of bits in the multi-bit cell includes two bits, including the particular bit and another bit, the other bit is sensed by applying a gate voltage to the multi-bit cell between the next to highest predetermined threshold voltage, and a next lower predetermined threshold voltage. In this case, the other bit is determined to have a first value if the current from the cell is less than a reference current indicating that the threshold gate voltage is higher than the voltage applied to the cell, and determines that the other bit has a second value if the current from the cell is greater than the reference current indicating that the threshold gate voltage is lower than the gate voltage applied to the cell. In this way, two bits may be sensed from a single memory cell having one of four predetermined threshold voltages.

Thus, the present invention provides advantages over conventional MLC sensing by providing a low cost, sense amplification circuit with logic that is independent of the order of the sensing of the low or high bit data, with increased reading margin and increased reading speed over conventional MLC sensing circuits.

To achieve these and other advantages of the invention with the purpose of the present invention, as embodied and broadly described, the present invention can be characterized according to one aspect as a sense amplifier for a multi-bit memory cell, including logic responsive to a bit address of a memory cell to enable one of an inverting and a non-inverting circuit during a reading of the word line determining at least two bits of data in the memory cell.

A further aspect of the present invention can be characterized as a sensing circuit for a multi-bit memory cell in a memory array, the memory cell having memory cells with a plurality of threshold voltages. The sensing circuit determines two bit data of the memory cell by sensing an output of a bit line coupled to the memory cell, the sensing circuit includes a word line voltage driver responsive to a memory cell bit address and a logic circuit responsive to the memory cell bit address for determining the two-bit data. The logic circuit is also adapted to respond to a first bit address by providing a first logic state indicating whether the output of said bit line corresponds to one of a low threshold voltage group and a high threshold voltage group. The logic circuit is further adapted to respond to a second memory cell bit address by providing a second logic state indicating whether the output of the bit line corresponds to one of an outer threshold voltage group and an inner threshold voltage group.

A further aspect of the present invention can be characterized as a sense amplifier for a multi-bit memory cell, including a first comparator in communication with said memory cell. A second comparator is in communication with the memory cell, and a controller is in communication with the first and second comparator. The controller includes resources responsive to the bit address of the memory cell determining at least two bit data of the memory cell.

A further aspect of the present invention can be characterized as a reading circuit for a multibit memory cell in a memory array. The memory cell having a threshold gate voltage within a range of one of first, second, third and fourth predetermined threshold voltages corresponding respectively to four states of two bits stored in the memory cell, including a circuit to provide a gate voltage to the multibit memory cell during a read cycle. The gate voltage has a first level between the second and third predetermined threshold voltages during a first time interval of the read cycle and a second level between the third and fourth predetermined threshold voltages during a second time interval of the read cycle. The sensing circuit is coupled to the multibit memory cell which compares current from the multibit memory cell to a first reference current and a second reference current, and produces a first output during the first time interval having a first logic state if the current from the cell exceeds the first reference current. The sensing circuit also includes a second logic state if the current from the cell is less than the first reference current, and produces a second output during the second time interval having a first logic state if the current from the cell is less than the second reference current and greater than the first reference current. The sensing circuit further includes a second logic state for if the current from the cell is greater than the first reference current and less than the second reference current.

A further aspect of the present invention can be characterized as a sensing method further including receiving an nth reference current from a nth comparator and receiving current from the multibit memory cell and receiving a (n+1)th reference current from a (n+1)th comparator and a current from the multibit memory cell. The method further provides an output based on logic coupled to the nth and (n+1)th comparators, operating during a nth time interval providing an output of the nth comparator as the nth output, and operating during the (n+1)th time interval providing the output of the nth comparator as the (n+1)th output if the output of the (n+1)th comparator has a first value, and provides the output of the nth comparator inverted as the (n+1)th output if the output of the (n+1)th comparator has a second value, wherein n is a integer equal to 2, 3, 4, . . . .

Additional features and advantages of the invention will be set forth in the description which follows, and in part will be apparent from the description, or may be learned by practice of the invention. The aspects and other advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE FIGURES

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Figure 1:
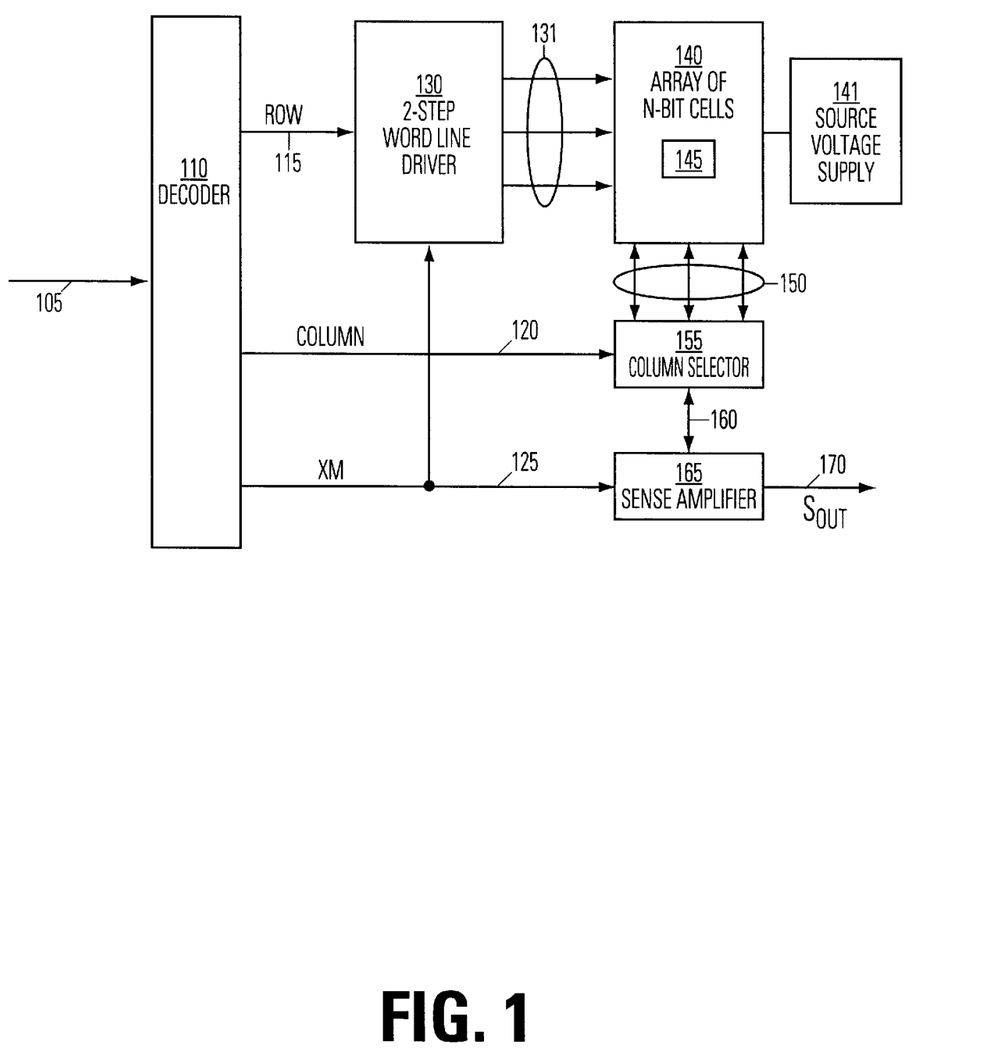
FIG. 1 depicts an operational block diagram of the present invention.

A detailed description of the present invention is provided with respect to the figures, in which FIG. 1 provides a simplified block diagram of a multi-level memory array according to the present invention.

In FIG. 1, an array 140 of multi-bit memory cells is included. The multi-bit memory cells may include mask ROM cells which have been manufactured with cells having a plurality of threshold voltages, in a preferred embodiment for threshold voltages $V_{T0}$, $V_{T1}$, $V_{T2}$ and $V_{T3}$. In alternative systems, rather than mask ROM other multi-level cell embodiments may be utilized, for example multi-level programmed floating gate memory cells may be utilized in a preferred embodiment.

With reference to the block diagram in FIG. 1, the array includes ROM or floating gate cells, or other multi-level cells. An address is supplied on line 105 to a decoder 110. The decoder applies row addresses on line 115 to a two step word line driver 130. Column addresses are applied on line 120 to a column select circuit 145. An address signal XM is supplied by the decoder 110, corresponding to a single bit in the address 105 for example, to the two step word line driver 130, and to a sense amplifier circuit 165. The two step (or one step in some embodiments) word line driver 130 selects one of a plurality of word lines 135 which is coupled to the array 140. The column address on line 120 causes the column select circuit 155 to select one of a plurality of data lines 150 to be selected onto a data line 160. Sense amplifier 165 determines the value of the data in the selected memory cell 145 in response to the address bit XM selected either the high bit or the low bit for a two bit cell. The output S(OUT) is provided on line 170 from the sense amplifier.

Also included in the diagram is a source voltage supply circuit 141 which applies a source voltage to memory cells in the array. At least one of the word line driver and the source voltage supply are responsive to the address bits and control logic in the device to apply a gate-to-source voltage to the selected memory cells. The gate-to-source voltage used for sensing the value of the multiple bits in the cell is responsive only to the address bits and the control logic in the device, and does not depend on the output of the sense amplifier from one sensing step to determine the word line levels to be driven.

Thus, an one bit in a multi-level cell may be sensed in a single read cycle with a word line voltage predetermined or fixed, without requiring the sensing of other bits in the cell. Table 1 set forth below illustrates the sensing logic in a preferred embodiment of the present invention. According to this embodiment, the supply potential VDD is approximately 3.3 volts. A two bit cell has one of four threshold voltages $V_{T0}$ through $V_{T3}$. $V_{T3}$ is approximately 4 volts, $V_{T2}$ is approximately 2.5 volts, $V_{T1}$ is approximately 2 volts, and $V_{T0}$ is approximately 0.8 volts in this embodiment. The low bit corresponding to address XM=0 and the high bit corresponding to address XM=1 are defined in the right hand two columns of the table. Of course other combinations of supply potential and threshold voltages may be utilized. Also cells having more than four threshold voltages may be utilized according to the present invention.

TABLE 1

| Threshold Voltage | VT(VDD = 3.3 V) | Low Bit | High Bit |
|---|---|---|---|
| $V_{T3}$ | 4 V | 0 | 0 |
| $V_{T2}$ | 2.5 V | 0 | 1 |
| $V_{T1}$ | 2.0 V | 1 | 1 |
| $V_{T0}$ | 0.8 V | 1 | 0 |

Thus, when the low bit data is being determined investigation of current $I_{CELL}$ is confined to whether there is an $I_{CELL}$ current or not. By raising $V_W$ to 2.3V which is just above the 2.0V of $V_{T1}$, as depicted in TABLE 1, either there will be an $I_{CELL}$ current or not. This is because $V_W$ will either be below the threshold of $V_{T2}$ and $V_{T3}$, which is below the threshold required to produce an $I_{CELL}$ current. By choosing $V_W$ between $V_{T1}$ and $V_{T2}$ determination can be made that the logic for the low bit corresponds to one of regions 410 (lower threshold voltage group) or 420 (high threshold voltage group) of FIG. 4. Thus, as depicted in TABLE 1, $V_{T0}$ and $V_{T1}$ are assigned a logic state of "1" and $V_{T2}$ and $V_{T3}$ are assigned a logic state of "0" for the low bit address of the cell. It should be noted that the logic states depicted in TABLE 1 could be reversed, in that each one could be made a zero and each zero a one. Of coursed the logic circuit would have to be altered to accommodate such a change, but the same result of identifying the data contained in the cell would be achieved.

With respect to the high bit determination, a $V_W$ of 2.8V is applied to the n-bit cell, which is greater than $V_{T2}$ but less than $V_{T3}$. In this scenario an $I_{CELL}$ current will flow for any cell level with a threshold voltage below $V_W$ of 2.8 v, i.e.

$V_{T0}$, $V_{T1}$ and $V_{T2}$. For the regions of the multi-level cell with voltage thresholds of $V_{T1}$ and $V_{T2}$ only a small to moderate $I_{CELL}$ current will flow. For the region of the multi-level cell with a voltage threshold of $V_{T0}$ a larger $I_{CELL}$ current will flow. The sense amplifier and its associated logic need only be able to differentiate between no current flow, which is very easily done, and a large and small $I_{CELL}$ current flow. A zero current flow corresponds to region 440 of FIG. 4 and a larger $I_{CELL}$ current flow corresponds to region 450. Regions 440 and 450 (outer threshold voltage group) are assigned logic states of "0". No differentiation is performed between the $V_{T1}$ and $V_{T2}$, which corresponds to region 430 (inner threshold voltage group) of FIG. 4 and are assigned a logic state of "1".

Figure 4:
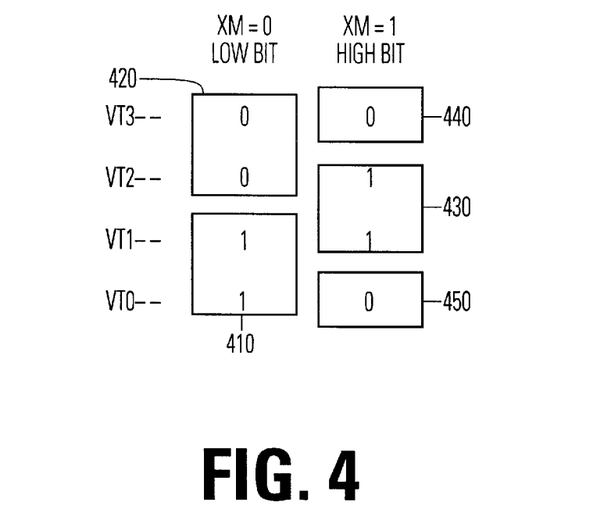
FIG. 4 depicts a diagram illustrating the logic relationship with respect to $V_{T0}$, $V_{T1}$, $V_{T2}$ and $V_{T3}$.

Based upon the assigned logic states a determination of n-bit cell data can be performed without regard to the order in which the low bit or the high bit data is retrieved. As previously noted the logic state of a "1" or "0" assigned is arbitrary as long as the relationships depicted in FIG. 4 are maintained between regions 410, 420, 430 and 440, the result will be exactly the same, assuming the logic circuit is modified to reflect the change of the logic state designations.

Figure 2:
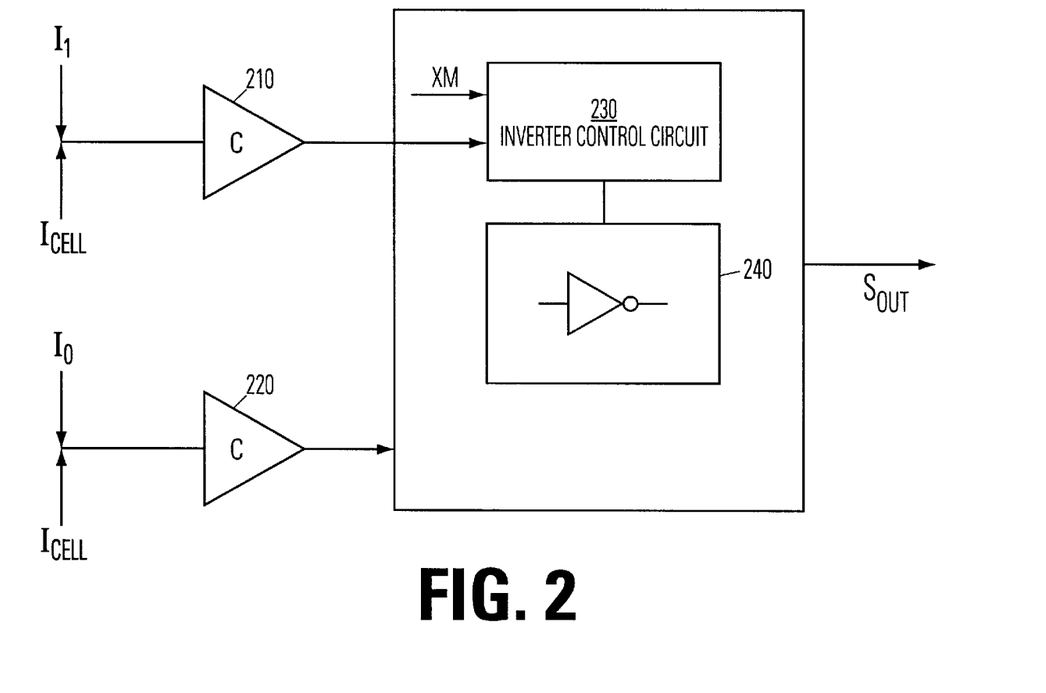
FIG. 2 depicts an operational block diagram of the logic circuit of the sense amplifier of the present invention.
Figure 3A:
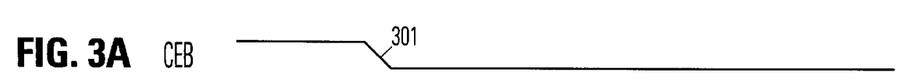
FIG. 3(A) depicts a chip enable pin (CEB) timing diagram during a first and second cycle of the read operation for the logic circuit of FIG. 1.
Figure 3B:
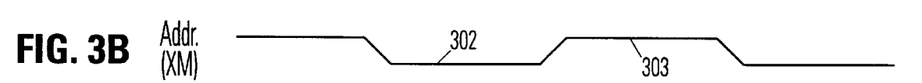
FIG. 3(B) depicts a timing diagram for address XM during a first and second cycle of the read operation for the logic circuit of FIG. 1.
Figure 3C:
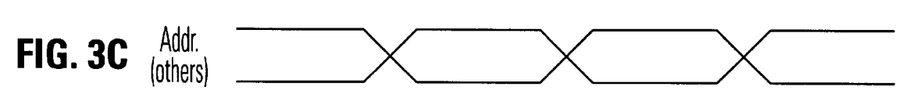
FIG. 3(C) depicts a timing diagram for non-XM addresses during a first and second cycle of the read operation for the logic circuit of FIG. 1.
Figure 3D:
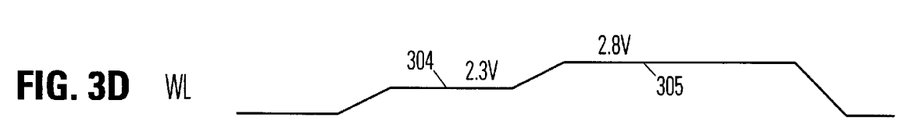
FIG. 3(D) depicts a timing diagram illustrating the word line voltage level during a first and second cycle of the read operation for the logic circuit of FIG. 1.
Figure 3E:
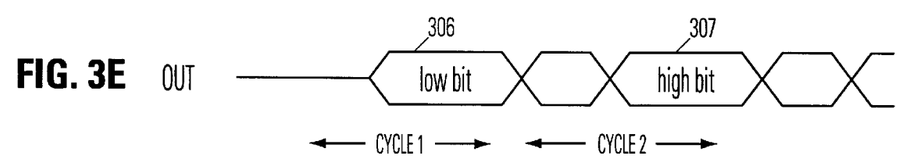
FIG. 3(E) depicts a timing diagram illustrating the sense amplifier output voltage level during a first and second cycle of the read operation for the logic circuit of FIG. 1.

FIG. 2 is a simplified block diagram of the sense amplifier. FIGS. 3A through 3E illustrate the timing of the control signals for the circuit of FIG. 1. In combination, the present invention can be understood with reference to FIGS. 2 and 3A through 3E. FIGS. 3A through 3E illustrate the chip enable signal (CEB), which is set low at 301 at the beginning of a read cycle. The address bit XM is low during a first interval 302 of the read cycle and high during a second time interval 303 of the read cycle. The other address bits are valid during the first time interval 302 and the second time interval 303. The two-step word line driver 530 produces a word line voltage which goes to a first gate voltage at level 304 during the first time interval 302 and to a second gate voltage at level 305 during the second time interval 303. The output of the sense amplifier 550 for the low bit is provided during time interval 306 and for the high bit is provided during time interval 307.

In this example, the cycle for XM=0 and the cycle for XM=1 are illustrated as part of a single read cycle. In various embodiments, the read cycles may be completely independent allowing for sensing of the low bit, independent of sensing of the high bit and vice versa. Also, the order in which the low bit and high bit are sensed may be reversed.

With reference to FIG. 2, and the timing diagram of FIGS. 3A through 3E, the operation of the sensing circuit may be understood. In FIG. 2, current from the cell $I_{CELL}$ is provided to a first comparator 210 and second comparator 220. The first comparator 210 compares the cell current to a first reference current $I_1$, and the second comparator 220 compares the cell current to a second reference current $I_0$. The output of the first comparator 210 is supplied to an inverter control circuit 230. Also, the address bit XM is supplied to the inverter control circuit 230. The sense amplifier includes a first output path including inverter 240, and a second non-inverting output path. Thus, the logic is able to provide the output of the comparator 220 through inverter 240 as the output $S_{OUT}$ during one state, and provide the output of the comparator 220 non-inverted in a second state. The inverter control circuit 230 selects the data paths to determine the state of the output signal.

When the signal XM is zero, the inverter control circuit always selects the path not including inverter 240 so that the output of the comparator 220 is provided as the output. When XM=1, the inverter control circuit selects inverter 240 as the output path if the output of the comparator 210 has one state, and selects the data path not including inverter 240 if the output of the comparator 210 has the other state. In operation, for sensing the low bit the address bit XM is zero, and a word line is stepped to a threshold voltage in the preferred embodiment of approximately 2.3 volts. This is a threshold voltage between $V_{T2}$ and $V_{T1}$. In this case, if current from the $I_{CELL}$ is less than $I_0$, the comparator 220 will output a logic one. This output will be provided as one on line $S_{OUT}$. Conversely, if the current from the $I_{CELL}$ is greater than the current $I_0$, then the comparator 220 will output a zero, which will be provided as the signal $S_{OUT}$. Thus, as shown in FIG. 4, the low bit is zero if the threshold voltage is higher than the voltage applied during the low bit read cycle, and one if the threshold voltage is less than the voltage applied during the low bit read cycle.

During the high bit read cycle, the comparator 210 is utilized to control the inverter control logic 230. In this case, the word line voltage is set at a voltage of approximately 2.8 volts in this example, which is a voltage between the $V_{T3}$ and the $V_{T2}$. That is, a voltage between the highest threshold voltage of the multi-bit cell and the next-to-highest threshold voltage of the multi-bit cell. In this case, if the current from the cell is greater than the reference current $I_1$, then the output of the comparator 210 will cause the inverter control circuit to select the data path including the inverter 240. If the current from the cell is less than the reference current $I_1$, then the comparator 210 will cause the inverter control circuit 230 to select the output of the comparator 220 directly as $S_{OUT}$. If the current from the cell is less than the reference current $I_0$, it must also be less than the reference current $I_1$ and the output of the comparator 220 supplies a logic 1 for the output $S_{OUT}$. If the cell current $I_{CELL}$ is greater than the current $I_0$, then the output of the comparator is supplied as the output $S_{OUT}$ provided the cell current is less than the reference current $I_1$.

The reference current $I_1$ is utilized only for sensing the high bit, when XM=1, and the word line is driven to the threshold voltage between the highest and next-to-highest levels of the cell to be sensed. Thus, the reference current $I_1$ is set to a level which is the minimum current expected from a memory cell having the threshold voltage $V_{T0}$ when the word line voltage is set to 2.8 volts in this example. If the current from the cell exceeds this minimum, then it can be assumed that the cell current is generated by a memory cell having the threshold voltage $V_{T0}$.

The reference current $I_0$ is utilized during both the low bit and high bit sensing. Thus, it is set at a level which is less than the minimum current to be sensed from a memory cell having a threshold of $V_{T1}$ or $V_{T0}$ when the word line voltage is set to 2.3 volts, that is a level between the threshold level $V_{T2}$ and $V_{T1}$. Also it must be set at a level which is less than the minimum current to be sensed when the word line voltage is 2.8 volts and the threshold is $V_{T2}$ or $V_{T1}$. However, it is used for sensing a transition between current conducting and virtually no current conducting. Thus, the margin for error in the reference current $I_0$ is relatively large.

Figure 5A:
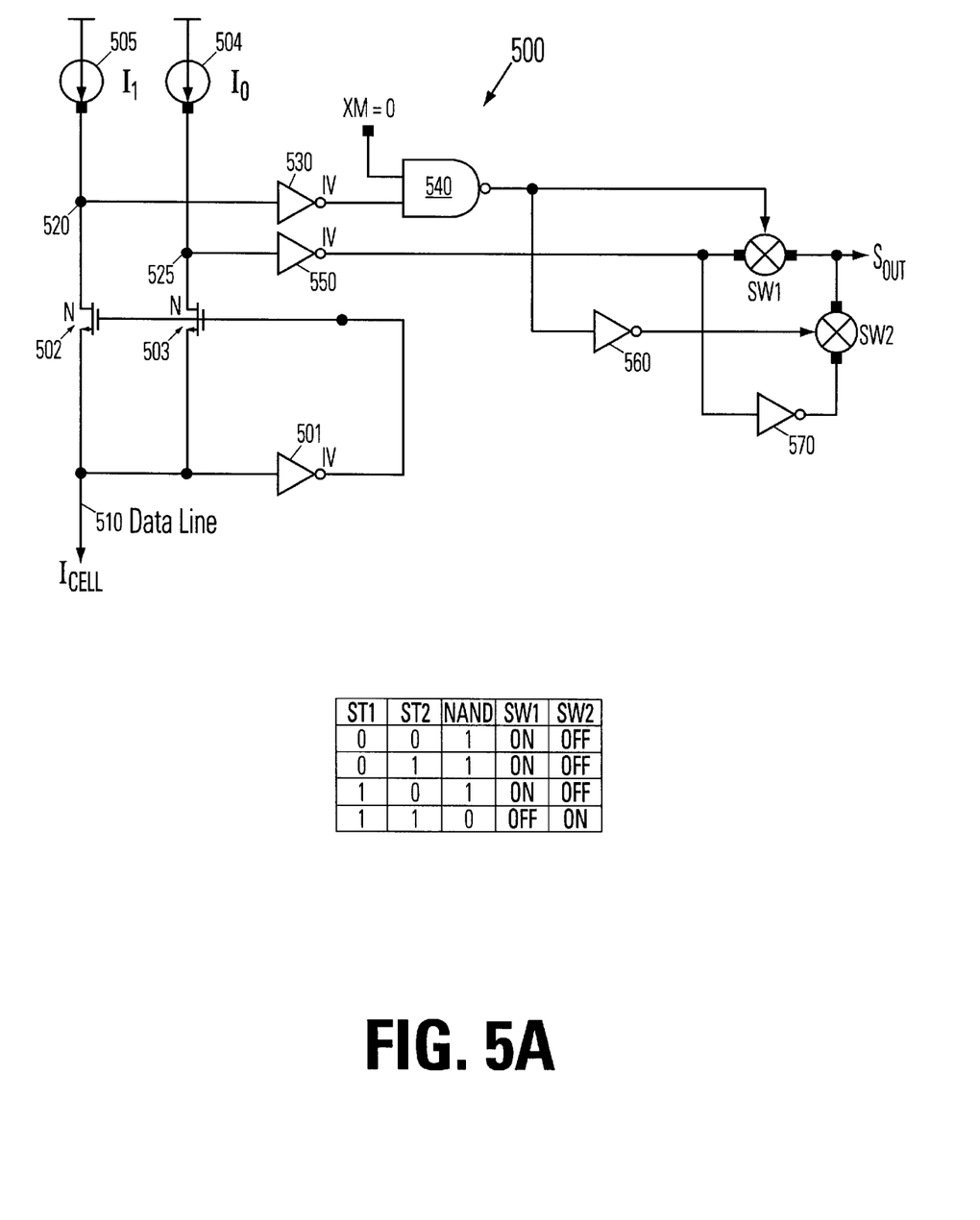
FIG. 5(A) depicts a general logic circuit diagram for a memory cell of the present invention.

The margin for error in the reference current $I_1$ is similarly great, because it is sensing between the current of a cell having the lowest threshold voltage $V_{T0}$ and the current from a cell having the threshold voltage $V_{T1}$. The margin of safety in the current $I_1$ can be increased by making the threshold voltage $V_{T0}$ much less than the threshold voltage $V_{T1}$. In the preferred embodiment, the threshold voltage $V_{T0}$ is approximately 0.8 volts, while the threshold voltage $V_{T1}$ is approximately 2.0 volts. This provides significant margin for safety in the reference current $I_1$. FIG. 5(A) illustrates a sense amplifier in a preferred embodiment in the present invention. In FIG. 5(A), the cell current $I_{CELL}$ is provided on the data line 510. The data line 510 is coupled to the input of inverter 501 and to the source of transistors 502 and 503 respectively. The gates of transistors 502 and 503 are coupled to the output of the inverter 501. Thus, when the data line 500 is in a condition for sensing, the inverter 501 will drive the gates of transistors 502 and 503 into the on condition allowing current from the cell to be provided to the sense amplifier at nodes 520 and 525 respectively. First reference current $I_0$ is supplied from current source 504, a second reference current $I_1$ is provided from current source 505. The first reference current $I_0$ is coupled to node 525. Node 525 is connected to the input of inverter 550. The output of the inverter 550 provides the output of the current comparator for the reference current $I_0$. Node 520 is coupled to the input of inverter 530. The output of inverter 530 provides the output of the current comparator for the node 520 and the reference current $I_1$. The output of inverter 530 is connected to the input of NAND gate 540. The second input to NAND gate 540 is the address bit XM. The output of the NAND gate 540 is connected to a switch, SW1, and through inverter 560 to a second switch, SW2. The switch SW1 couples the output of the inverter 550 to the output $S_{OUT}$ of the sense amplifier directly. If switch SW1 is open and switch SW2 is closed, then the output of the inverter 550 is supplied through inverter 570 as the output $S_{OUT}$ providing the output of the current comparison at node 525 inverted as the output $S_{OUT}$. As illustrated in the Figure, when the address bit XM is zero, then the output of the NAND gate is high independent of the output of the inverter 130. This in effect maintains switch SW1 closed during the sensing of the low bit and switch SW2 open. Thus, the low bit is indicated by the output of the comparator of the cell current with the reference current $I_0$.

Figure 5B:
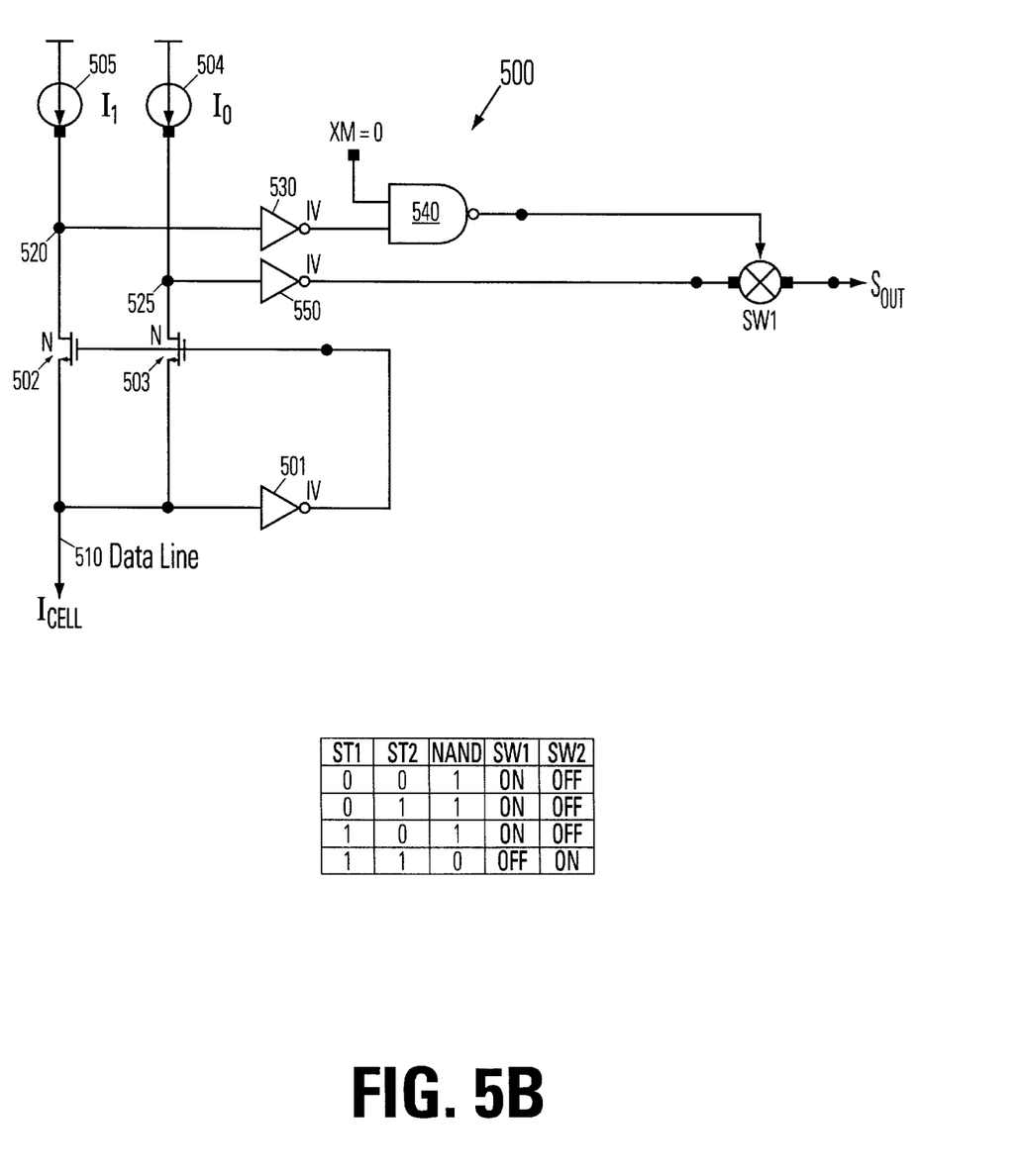
FIG. 5(B) depicts the output of a logic circuit diagram for memory cell current where $V_W=2.3V$ and $I_{CELL}<I_0$ of the present invention.
Figure 5C:
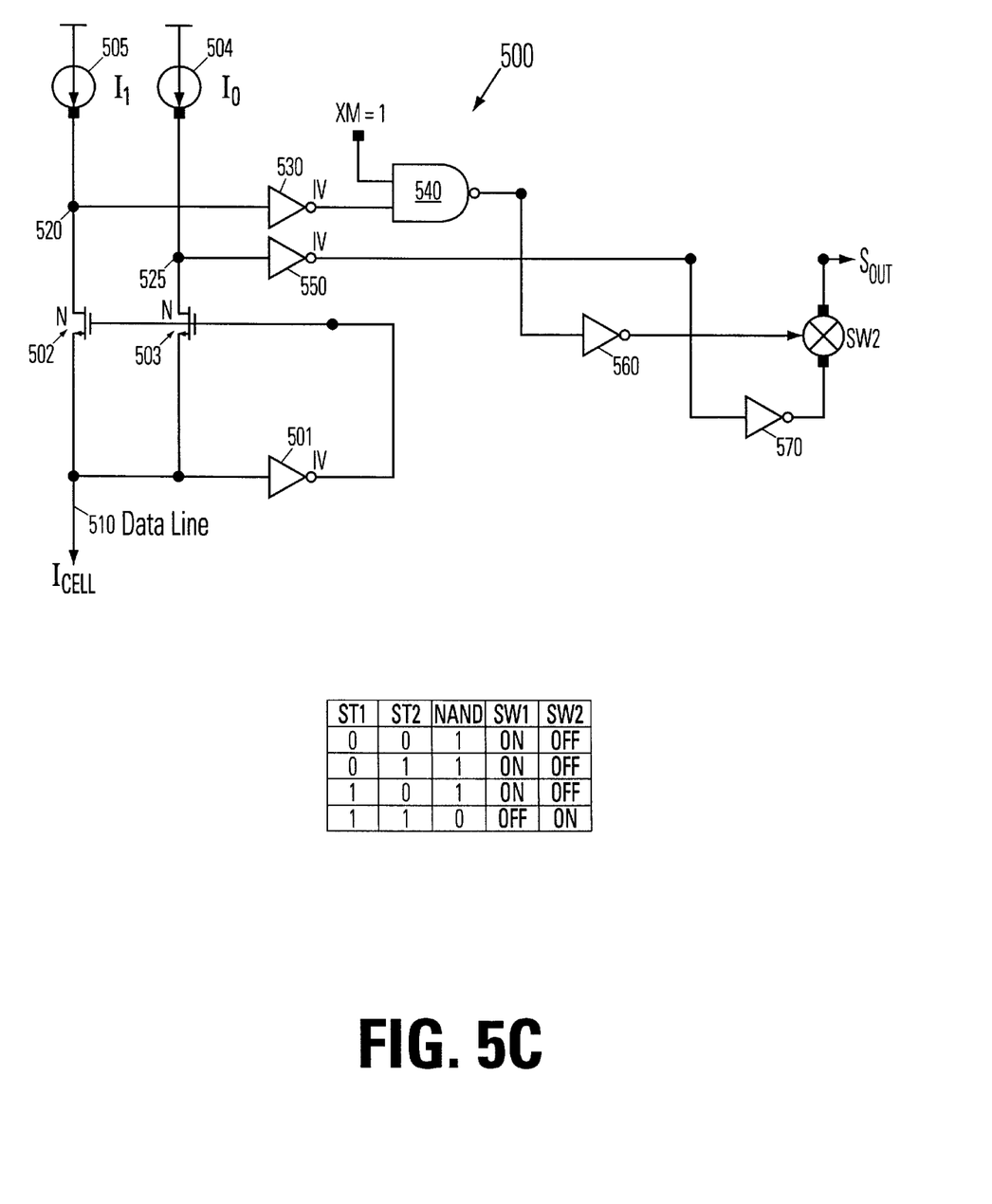
FIG. 5(C) depicts the output of a logic circuit diagram for memory cell current wherein $V_W=2.3V$ and $I_{CELL}>I_0$ of the present invention.

When XM=1, two conditions may occur as illustrated in FIGS. 5(B) and 5(C) respectively. In the first condition the output of the comparator for node 520 is zero. In this case, the switch SW1 is open and the switch SW2 is closed causing inverter 570 to be inserted into the path between the output of the comparator for node 525 and the output $S_{OUT}$. When the output of the comparator for the node 520 is one as illustrated in FIG. 5(C), then the logic causes the switch SW1 to be closed and the switch SW2 to be open. Thus the output of the comparator for the node 525 is coupled directly as the output $S_{OUT}$ of the sense amplifier.

Figure 5D:
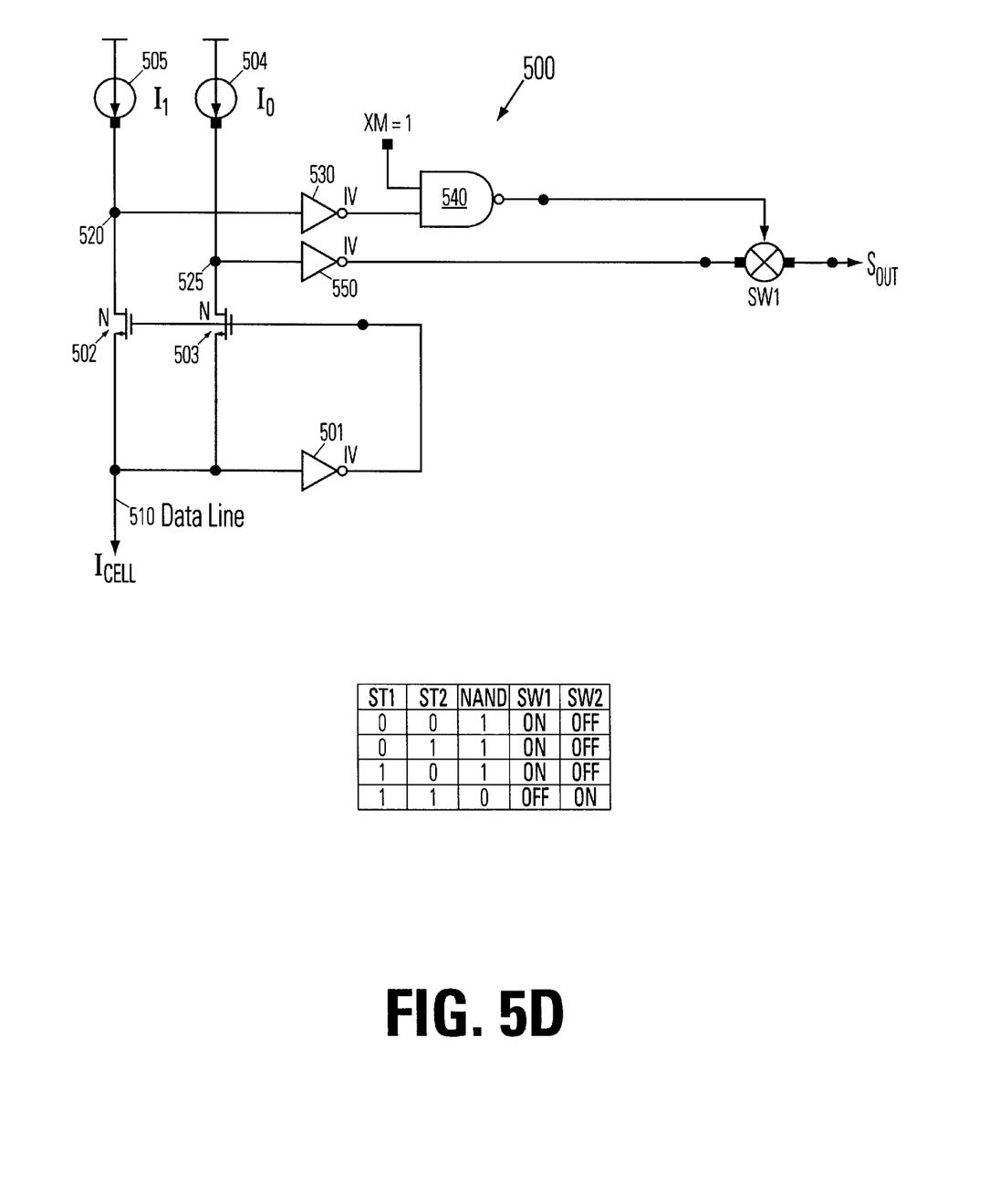
FIG. 5(D) depicts the output of a logic circuit diagram for memory cell current wherein $V_W=2.8V$ and $I_{CELL}<I_0$ of the present invention.
Figure 5E:
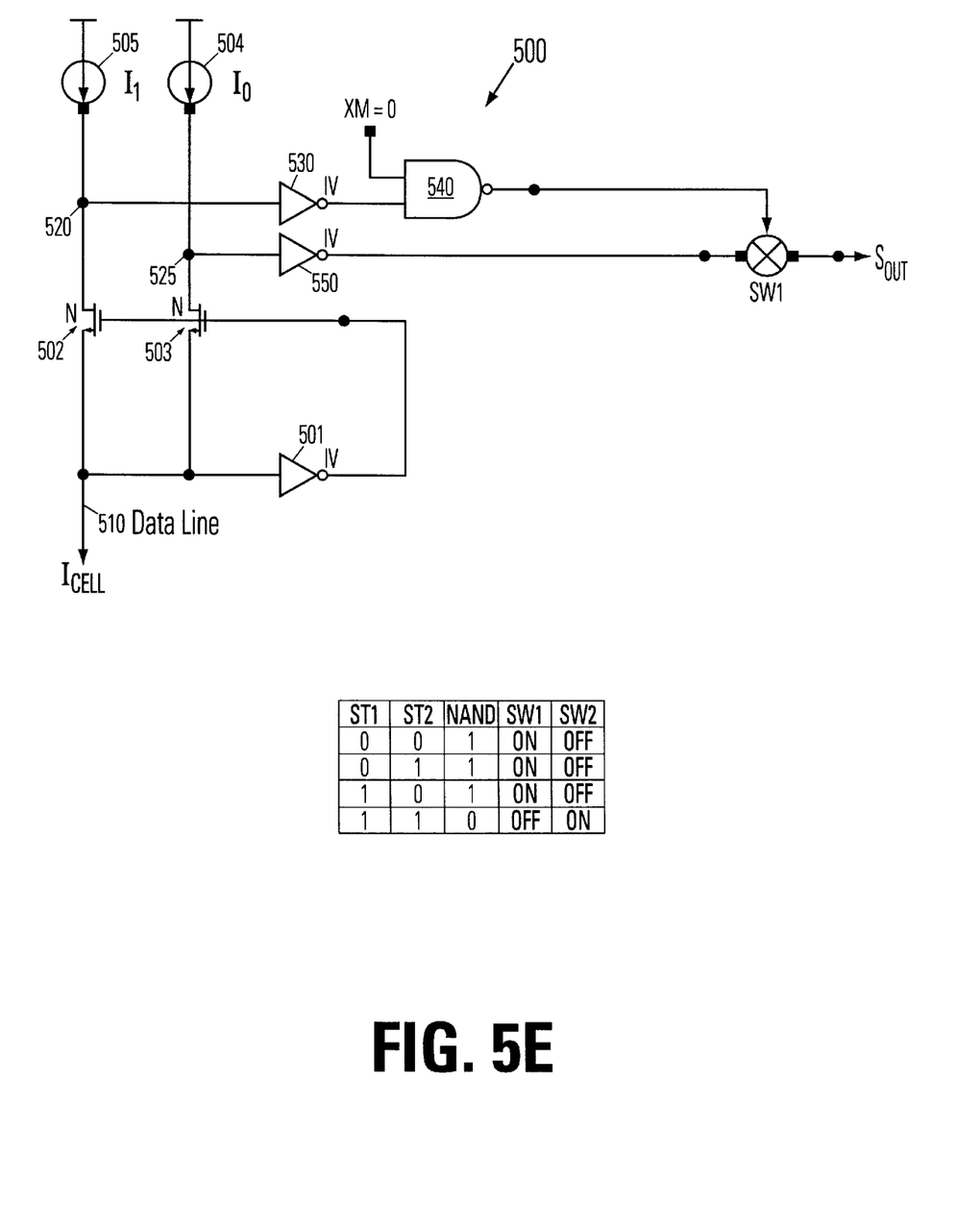
FIG. 5(E) depicts the output of a logic circuit diagram for memory cell current wherein $V_W=2.8V$ and $I_{CELL}>I_0$ of the present invention.
Figure 6A:
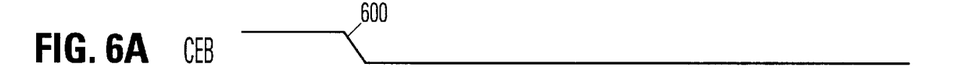
FIGS. 6(A)–6(F) and FIGS. 7(A)–7(F) illustrate timing diagrams for the voltages applied to the selected memory cells during sensing of the low and high bits of a two bit memory cell according to alternative embodiments of the present invention.
Figure 6B:
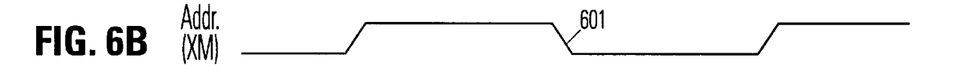
Figure 6C:
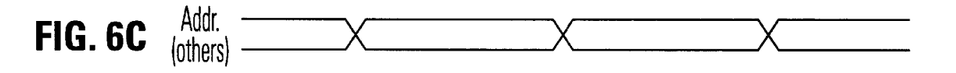
Figure 6D:
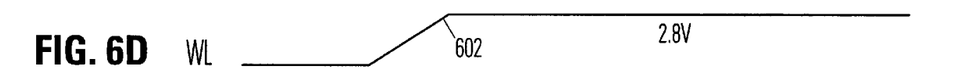
Figure 6E:
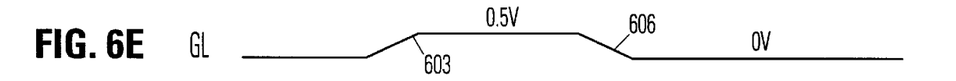
Figure 6F:
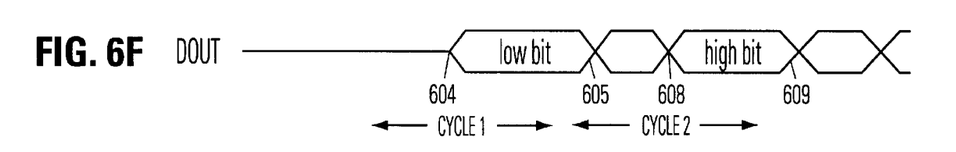
Figure 7A:
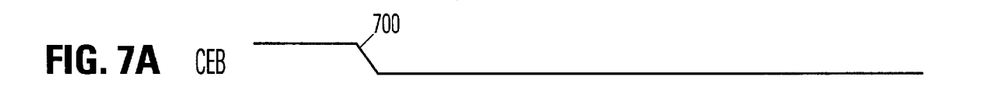
Figure 7B:
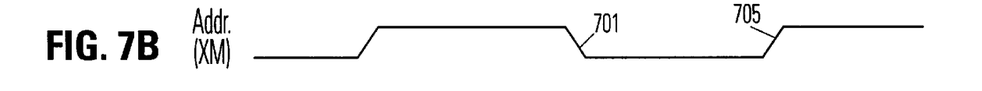
Figure 7C:
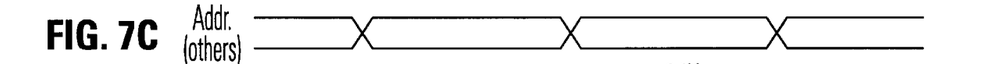
Figure 7D:
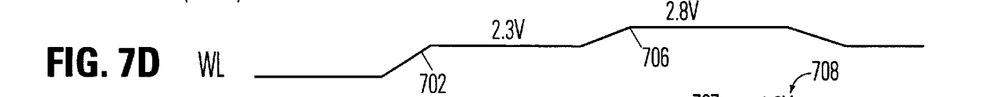
Figure 7E:
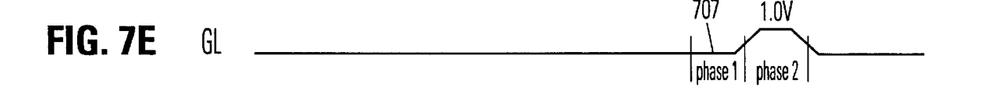
Figure 7F:
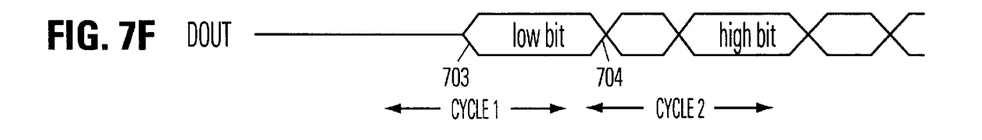

When XM=0, two conditions may occur as illustrated in FIGS. 5(D) and 5(E) respectively. In the first condition the output of the comparator for node 520 is zero. In this the logic causes the switch SW1 to be closed and the switch SW2 to be open, thus the output of the comparator for the node 525 is coupled directly as the output $S_{OUT}$ of the sense amplifier. If the output of the comparator for the node 520 is one as illustrated in FIG. 5(E), the logic causes the switch SW1 to be closed and the switch SW2 to be open, thus the output of the comparator for the node 525 is again coupled directly as the output $S_{OUT}$ of the sense amplifier.

According to the sequence illustrated in FIGS. 6(A)–6(F) a chip enable signal CEB transitions to the low state at time 600. The address bit XM and the other address bits are valid during an interval between the time 600 and the time 601. If the address bit XM is high during that interval as indicated in the figure, the word line voltage is raised to a level of about 2.8 volts, corresponding to a level above the threshold voltage $V_{T2}$ and below $V_{T3}$, and reaches that level at time 602. Also, the ground line connected to the selected cell is raised to a voltage level of about 0.5 volts and reaches that level at a time of about 603. Data out is sensed during the interval beginning at time 604 and ending at time 605 for the low bit when address bit XM is high. During this interval, the gate-to-source voltage is defined by the difference between the word line voltage and the ground line voltage is at about 2.3 volts or a level between the threshold voltages $Vt_1$ and $Vt_2$. During a next cycle, or if the address bit XM is low independent of other cycles, the word line voltage is maintained again at the fixed level of 2.8 volts which is a level above the threshold voltage $Vt_2$. However, for the high bit, the ground line voltage is set during the interval 606 to a level of about 0 volts. Thus, during sensing of the high bit in the interval from time 608 to time 609, the gate-to-source voltage is fixed at a level of about 2.8 volts, above the threshold voltage $Vt_2$. The sense amplifier described above is utilized for sensing the low bit and the high bit according to this scheme. One advantage of the scheme illustrated in FIGS. 6(A)–6(F) is that the word line driver can be simplified to provide a single level during sensing. It comes at the cost however of a source voltage supply, such as the supply 141 of FIG. 1, which must be able to switch between 0.5 volts and ground, or other similar levels in response to the address bit XM.

FIGS. 7(A)–7(F) illustrate yet another alternative embodiment. According to the embodiment of FIGS. 7(A)–7(F), a single current comparator can be utilized in the sense amp. This is accomplished by the following sequence. As with other embodiments, when the chip enable signal falls low at time 700, the address bit XM and other address bits become valid during the interval between time 700 and time 701. If XM is high, a low bit is sensed and a word line voltage is raised to a level of about 2.3 volts in this example at time 702. The ground line voltage is maintained at ground for this example. In this way, the gate-to-source voltage is fixed at a level between the threshold voltage $Vt_1$ and $Vt_2$ sensing the low bit during the interval between times 703 and 704. This is accomplished by determining whether the current at the sense amplifier from the cell falls above or below the reference current $I_{REF}$. During the sensing of the high bit, as indicated during the interval between time 701 and time 705, the address bit XM is low. This time, the word line voltage is raised to a value of about 2.8 volts at time 706 in this example. The high bit is sensed in a first step or phase and a second step or phase. During the first phase 707, the ground line voltage remains near 0 volts. During the second phase 708 the ground line voltage is raised to a level of about 1.0 volts. The sense amplifier detects whether the current from the cell exceeds the first reference current during the first phase, indicating that the threshold voltage of the cell is below the threshold $Vt_2$, and during the second phase again indicating whether the threshold voltage of the cell is below the difference between the voltage on the word line and the voltage on the ground line which is established at a level below $Vt_1$ and above $Vt_0$. Thus, this technique allows for sensing a low bit in a multi-bit memory cell by determining whether the threshold voltage of the cell falls within a high group having a threshold above 2.3 volts, and a low group having a threshold below 2.3 volts for this example. During sensing of the high bit, this technique allows using a single reference current source for determining whether the threshold voltage of the memory cell falls within the outer group having a threshold voltage above 2.8 volts or below 1.8 volts, or has a threshold voltage between 2.8 volts and 1.8 volts. The high bit and the low bit can be sensed independent of one another using independent gate-to-source voltage cycles.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. A method for sensing a particular bit in a plurality of bits in a multibit cell having a threshold voltage within a range of one of a plurality of predetermined threshold voltages which includes a highest, a next to highest and a lowest predetermined threshold voltage, comprising:

applying a gate-to-source voltage to the multibit cell between the highest and the next to highest predetermined threshold voltages to produce a cell current; and determining a first value for the bit if the cell current is less than a first reference current indicating that the threshold voltage is the highest predetermined threshold voltage, or if the cell current is greater than the first reference current and greater than a second reference current indicating that the threshold voltage is the lowest predetermined threshold voltage, and a second value for the bit if the cell current is greater than the first reference current and less than the second reference current indicating that the threshold voltage is one of the other predetermined threshold voltages in the plurality of predetermined threshold voltages.

2. The sensing method of claim 1, wherein the determination of the first and second values indicate two bits of the plurality of bits stored in the multibit memory cell.

3. The sensing method of claim 1, further comprising the steps of:

receiving at a first comparator the first reference current and the cell current;

receiving at a second comparator the second reference current and the cell current; and providing an output representing the two bit data based on logic coupled to the first and second comparators, and operating during a first time interval for providing the output of the first comparator as the first output, and operating during a second time interval for providing the output of the first comparator as the second output if the output of the second comparator has a first value, and providing the output of the first comparator inverted as the second output if the output of the second comparator has a second value.

4. The sensing method of claim 1, the method further comprising the steps of:

receiving an nth reference current at an nth comparator and the cell current;

receiving a (n+1)th reference current at a (n+1)th comparator and the cell current; and providing an output based on logic coupled to the nth and (n+1)th comparators, operating during an nth time interval for providing an output of the nth comparator as the nth output, and operating during the (n+1)th time interval for providing the output of the nth comparator as the (n+1)th output if the output of the (n+1)th comparator has a first value, and providing the output of the nth comparator inverted as the (n+1)th output if the output of the (n+1)th comparator has a second value, wherein n is an integer equal to 2, 3, 4, . . .

5. The sensing method according to claim 1, wherein determination of the first value for the bit is performed during a time interval occurring before a read cycle for determining the second value for the bit.

6. The sensing method according to claim 1, wherein determining of the second value for the bit is determined during a time interval occurring before a read cycle for determining the first value for the bit.

7. A method for sensing data in a multibit cell having a gate, a source and a drain, and having a threshold gate-to-source voltage within a range of one of a plurality of predetermined threshold voltages, comprising:

selecting a bit in the multibit cell in response to a select signal;

applying a gate-to-source voltage across the gate and source of the multibit cell, in response to the selected bit; and detecting during the step of applying the gate-to-source voltage a state of the selected bit.

8. The method of claim 7, wherein the step of applying a gate-to-source voltage, includes applying a first predetermined gate voltage to the gate of the multibit cell in response to selection of a first bit stored in the multibit cell, and applying a second predetermined gate voltage to the gate of the multibit cell in response to selection of a second bit in the multibit cell.

9. The method of claim 8, wherein the step of applying a gate-to-source voltage, includes applying a predetermined source voltage to the source of the multibit cell in response to selection of either the first bit or the second bit.

10. The method of claim 7, wherein the step of applying a gate-to-source voltage, includes applying a first predetermined source voltage to the source of the multibit cell in response to selection of a first bit stored in the multibit cell, and applying a second predetermined source voltage to the source of the multibit cell in response to selection of a second bit in the multibit cell.

11. The method of claim 10, wherein the step of applying a gate-to-source voltage, includes applying a predetermined gate voltage to the gate of the multibit cell in response to selection of either the first bit or the second bit.

12. A method for sensing data in a multibit cell having a gate, a source and a drain, and having a threshold gate-to-source voltage within a range of one of a plurality of predetermined threshold voltages, comprising:

selecting a first bit or a second bit in the multibit cell in response to a select signal;

detecting a state of the selected bit if the first bit is selected by determining whether the threshold voltage of the memory cell falls within a high threshold group including threshold voltages higher than a first level of the gate to source voltage indicating one binary state of the selected bit, or within a low threshold group including threshold voltages lower than the first level indicating another binary state of the selected bit, and if the second bit is selected by determining whether the threshold voltage of the memory cell falls within an inner threshold group including threshold voltages between a second level and third level indicating one binary state of the selected bit and an outer threshold group including threshold voltages greater than the second level and less than the third level indicating another binary state of the selected bit.

13. The method of claim 12, wherein the step of detecting includes:

applying a gate-to-source voltage across the gate and source of the multibit cell, in response to the selected bit, the gate-to-source voltage fixed at or near the first level if the first bit is selected, and fixed at or near the second level if the second bit is selected.

14. The method of claim 13, wherein the step of detecting includes comparing current from the cell to a first reference current if the first bit is selected, and includes comparing current from the cell to the first reference current and to a second reference current if the second bit is selected.

15. The method of claim 13, wherein the step of applying a gate-to-source voltage, includes applying a first predetermined gate voltage to the gate of the multibit cell in response to selection of the first bit stored in the multibit cell, and applying a second predetermined gate voltage to the gate of the multibit cell in response to selection of the second bit in the multibit cell.

16. The method of claim 15, wherein the step of applying a gate-to-source voltage, includes applying a predetermined source voltage to the source of the multibit cell in response to selection of either the first bit or the second bit.

17. The method of claim 13, wherein the step of applying a gate-to-source voltage, includes applying a first predetermined source voltage to the source of the multibit cell in response to selection of the first bit stored in the multibit cell, and applying a second predetermined source voltage to the source of the multibit cell in response to selection of the second bit in the multibit cell.

18. The method of claim 17, wherein the step of applying a gate-to-source voltage, includes applying a predetermined gate voltage to the gate of the multibit cell in response to selection of either the first bit or the second bit.

19. The method of claim 12, wherein the step of detecting includes:

applying a gate-to-source voltage across the gate and source of the multibit cell, in response to the selected bit, the gate-to-source voltage fixed at or near the first level if the first bit is selected, and applied in a sequence if the second bit is selected including a first step fixed at or near the second level, and a second step at or near the third level.

20. The method of claim 19, wherein the step of detecting includes comparing cell current to a first reference current if the first bit is selected to determine a binary state of the first bit, and comparing the cell current to the first reference current if the second bit is selected during the first and second steps.

21. The method of claim 19, wherein the step of applying a gate-to-source voltage, includes applying a first predetermined gate voltage to the gate of the multibit cell in response to selection of the first bit stored in the multibit cell, and applying a second predetermined gate voltage to the gate of the multibit cell during the first and second steps in response to selection of the second bit in the multibit cell.

22. The method of claim 21, wherein the step of applying a gate-to-source voltage, includes in response to selection of the first bit applying a first predetermined source voltage to the source of the multibit cell, and in response to selection of the second bit applying a second predetermined source voltage to the source of the multibit cell during the first step and a third predetermined source voltage to the source of the multibit cell during the second step.

23. The method of claim 22, wherein the first and second predetermined source voltages are substantially equal.

\* \* \* \* \*